US006269277B1

United States Patent
Hershenson et al.

(10) Patent No.: US 6,269,277 B1
(45) Date of Patent: Jul. 31, 2001

(54) SYSTEM AND METHOD FOR DESIGNING INTEGRATED CIRCUITS

(75) Inventors: Maria del Mar Hershenson, Palo Alto; Stephen P. Boyd, Stanford; Thomas H. Lee, Cupertino, all of CA (US)

(73) Assignee: The Leland Stanford Junior University Board of Trustees, Palo Alto, CA (US)

( * ) Notice: Subject to any disclaimer, the term of this patent is extended or adjusted under 35 U.S.C. 154(b) by 0 days.

(21) Appl. No.: 09/123,129

(22) Filed: Jul. 27, 1998

(51) Int. Cl.[7] .................................................. G06F 19/00
(52) U.S. Cl. ............................ 700/97; 700/98; 700/121; 716/1; 716/2; 716/5
(58) Field of Search .................................. 716/1, 2, 5, 6; 700/97, 98, 117, 121

(56) References Cited

U.S. PATENT DOCUMENTS

| | | | |
|---|---|---|---|
| 4,827,428 | * 5/1989 | Dunlop et al. ............................ | 716/1 |
| 5,633,807 | * 5/1997 | Fishburn et al. .......................... | 716/2 |
| 5,966,517 | * 10/1999 | Cronin, III et al. ...................... | 716/1 |
| 6,002,860 | * 12/1999 | Voinigescu et al. ..................... | 703/14 |

OTHER PUBLICATIONS

Aguirre et al., "Analog Design Optimization by Means of a Tabu Search Approach", *In Proceedings IEEE International Symposium on Circuits and Systems*, 1:375–378 (1994).

Chang et al., "A Top–Down, Constraint–Driven Design Methodology for Analog Integrated Circuits", *In Proceedings IEEE Custom Integrated Circuit Conference*, pp. 8.4.1–8.4.6 (1992).

Chávez et al., "Analog Design Optimization: A Case Study", *In Proceedings IEEE International Symposium on Circuits and Systems*, 3:2083–2085 (1993).

Fishburn and Dunlop, "TILOS: A Posynomial Programming Approach to Transistor Sizing", *In Proceedings IEEE International Conference on Computer–Aided Design*, pp. 326–328 (1985).

Gielen et al., "Analog Circuit Design Optimization Based on Symbolic Simulation and Simulated Annealing", *IEEE J. of Solid–State Circuits*, 25(3):707–713 (1990).

Kortanek et al., "An Infeasible Interior–Point Algorithm for Solving Primal and Dual Geometric Programs", *MathProgramming*, 76:155–181 (1996).

van Laarhoven and Aarts, "Simulated Annealing: Theory and Applications", D. Riedel Publishing Company (1987).

Maulik et al., "Integer Programming Based Topology Selection of Cell–Level Analog Circuits", *IEEE Transactions on Computer–Aided Design*, 14(4):401–412 (1995).

Maulik et al., "Sizing of Cell–Level Analog Circuits Using Constrained Optimization Techniques", *IEEE J. of Solid–State Circuits*, 28(3):233–241 (1993).

(List continued on next page.)

*Primary Examiner*—Paul P. Gordon
*Assistant Examiner*—Ramesh Patel
(74) *Attorney, Agent, or Firm*—Blakely, Sokoloff, Taylor & Zafman LLP

(57) ABSTRACT

A system for designing and optimizing integrated circuits. Design objectives and constraints are described as posynomial functions of the design parameters. The circuit design problem is then expressed as a special form of optimization problem called geometric programming, to which very efficient global optimization methods are applied. The present invention can thereby efficiently determine globally optimal circuit designs, or globally optimal trade-offs among competing performance measures such as, for example for an operational amplifier (op-amp), power, open-loop gain, and bandwidth. The present invention therefore yields automated synthesis of globally optimal circuit designs for a given circuit topology library, directly from specifications.

20 Claims, 3 Drawing Sheets

OTHER PUBLICATIONS

Medeiro et al., "A Statistical Optimization–Based Approach for Automated Sizing of Analog Cells", *In Proceedings of the 31st Annual Design Automation Conference*, pp. 594–597 (1994).

Nesterov and Nemirovskii, "Interior–Point Polynomial Algorithms in Convex Programming", Society for Industrial and Applied Mathematics, Philadelphia, PA, vol. 13 (1994).

Ochotta et al., "Synthesis of High–Performance Analog Circuits", *IEEE Transactions on Computer–Aided Design of Integrated Circuits and Systems*, 15(3):273–293 (1996).

Sapatnekar et al., "An Exact Solution to the Transistor Sizing Problem for CMOS Circuits Using Convex Optimization", *IEEE Transactions on Computer–Aided Design*, 12:1621–1623 (1993).

Sapatnekar, "Wire Sizing as a Convex Optimization Problem: Exploring the Area–Delay Tradeoff", *IEEE Transactions on Computer–Aided Design*, 15:1001–1011 (1996).

Shyu et al., "Optimization–Based Transistor Sizing", *IEEE J. of Solid–State Circuits*, 23(2):400–408 (1988).

Su et al., "Statistical Constrained Optimization of Analog MOS Circuits Using Empirical Performance Models", *In Proceedings IEEE International Symposium on Circuits and Systems*, 1:133–136 (1994).

Swings et al., "An Intelligent Analog IC Design System Based on Manipulation of Design Equations", *In Proceedings IEEE Custom Integrated Circuit Conference*, pp. 8.6.1–8.6.4 (1990).

Vassiliou et al., "A Video Driver System Designed Using a Top–Down, Constraint–Driven Methodology", *In Proceedings of the 33rd Annual Design Automation Conference*, (1996).

Wong et al., "Simulated Annealing for VLSI Design", Kluwer Academic Publishers (1988).

Wright, "Primal–Dual Interior–Point Methods", Society for Industrial and Applied Mathematics, Philadelphia, PA (1997).

Yang et al., "Simulated Annealing Algorithm with Multi–Molecule: an Approach to analog Synthesis", *In Proceedings of the 1996 European Design & Test Conference*, pp. 571–575 (1996).

\* cited by examiner

SYSTEM AND METHOD FOR DESIGNING INTEGRATED CIRCUITS

The present invention relates generally to integrated circuits, and particularly to a computer-aided design tool for designing globally optimal integrated circuits using geometric programs.

BACKGROUND OF THE INVENTION

The performance of an op-amp is characterized by a number of performance measures such as open-loop voltage gain, quiescent power, input-referred noise, output voltage swing, unity-gain bandwidth, input offset voltage, common-mode rejection ratio, slew rate, die area, etc. These performance measures are determined by the design parameters, e.g., transistor dimensions, bias currents, and other component values. Analog integrated circuits are still largely designed by engineers performing discrete computations, and then verifying circuit operation with simulation systems. By contrast digital integrated circuits are automatically synthesized from high level design specifications using computer-aided design (CAD) software tools.

Most digital integrated circuits are fabricated using complementary-metal-oxide-semiconductor (CMOS) processes. The numerous performance and cost advantages of combining related circuit blocks in a single integrated circuit device provide strong incentives to include required analog circuitry on the same die as the related digital circuitry. Designing analog circuits in a CMOS process further complicates the analog design process. As a result, the time required to design the analog portions of an integrated circuit generally is far greater than the time required to design the digital component of the circuit, even though the digital component typically constitutes the majority of the system.

A variety of limited CAD tools have been developed for analog circuit design, including optimization tools. General purpose conventional optimization methods, such as steepest descent, sequential quadratic programing and Lagrange multiplier methods, have been widely used in analog circuit CAD. For widely used general purpose optimization codes, see:

P. E. Gill, W. Murray, M. A. Saunders and M. H. Wrige, "User's guide for NPSOL (Version 4.0): A FORTRAN package for nonlinear programming," Tech. Rep. SOL 86-2, Operations Research Dept., Stanford University, Stanford, Calif. 94305, January 1986; and B. A. Murtagh and M. A. Saunders, "MINOS 5.4 user's guide," Tech. Rep. SOL 38-20R, Systems Optimization Laboratory, Stanford University, Stanford, Calif. 94305, December 1983.

For other CAD methods based on conventional optimizations, see:

H. Onodera, H. Kanbara, and K. Tamaru, "Operational amplifier compilation with performance optimization," *IEEE Journal of Solid-State Circuits*, vol.25, pp. 4660473, April 1990;

H. Y. Koh, C. H. Sequin, and P. R. Gray, "OPASYN: A compiler for CMOS operational amplifiers," *IEEE Transactions on Computer-Aided Design*, vol. 9, pp. 113–125, February 1990;

G. Jusuf, P. R. Gray, and A. Sangiovanni-Vincentelli, "CADICS—cyclic analog-to-digital converter synthesis," in *Proceedings IEEE International Conference on Computer-Aided Design*, 1990, pp. 286–289;

R. Chadha, K. Singhal, J. Vlach, E. Christen, and M. Vlach, "WATOPT: An optimizer for circuit applications," *IEEE Transactions on Computer-Aided Design*, vol. 6, pp. 472–479, May 1987; and J. P. Harvey, M. I. Elmasry, and B. Leung, "STAIC: An interactive framework for synthesizing CMOS and BiCMOS analog circuits," *IEEE Transactions on Computer-Aided Design*, vol. 11, pp.1402–1417, November 1992.

The primary problem with these conventional optimization tools is that they only find the locally optimal designs. This means that the design is at least as good as neighboring designs, i.e., small variations of any of the design parameters results in a worse (or infeasible) design. However, this does not mean that the design is the best that can be achieved, i.e., globally optimal. In fact, it is often the case that some other set of design parameters far away from the one produced by a local optimum, is better.

One approach to attempting to avoid this problem is to start the optimization method from many different initial designs, and to take the best result. However, it is still uncertain whether the result is the best possible design; this method merely increases the likelihood of finding the globally optimal design. Furthermore, this approach is often highly computational and time intensive. Furthermore, human intervention is required to evaluate the different optimization results and select one that is viewed to be the best. In addition these conventional optimization methods become even slower when used with complex device models.

Knowledge-based and expert-system methods have also been widely used in analog circuit CAD. Examples include generic analog or evolution systems, for instance see:

Z. Ning, T. Mouthaan, and H. Wallinga, "SEAS: A simulated evolution approach for analog circuit synthesis," in *Proceedings IEEE Custom Integrated Circuits Conference*, 1991, pp.5.2.1–5.2.4; and W. Kruiskamp and D. Leenaerts, "DARWIN: CMOS op amp synthesis by means of a genetic algorithm," in *Proceeding of the $32^{nd}$ Annual Design Automation Conference*, 1995, pp. 433–438.

For systems based on fuzzy-logic, see:

A. Torralba and J. Chávez and L. G. Franquelo, "FASY: A fuzzy-logic based tool for analog syntheses," *IEEE Transactions on Computer-Aided Design*, vol.15, pp. 705–715, July 1996.

For some heuristic-based systems, see:

M. G. R. Degrauwe, 0. Nys, E. Dijkstra, J. Rijmenants, S. Bitz, B. L. A. G. Goffart, E. A. Vittoz, S. Cxerveny, C. Meixenberger, G. Van Der Stappen, and H. J. Oguey, "IDAC: An interactive design tool for analog CMOS circuits," *IEEE Journal of Solid-State Circuits*, vol. 22, pp.1106–115, December 1987;

R. Harjani, R. A. Rutenbar, and L. R. Carley, "OASYS: A framework for analog circuit synthesis," *IEEE Transactions on Computer-Aided Design*, vol. 8, pp.1247–1265, December 1989;

F. El-Turky and E. E. Perry, "BLADES: An artificial intelligence approach to analog circuit design," *IEEE Transactions on Computer-Aided Design*, vol. 8, pp. 680–692, June 1989; and S. K. Gupta and M. M. Hasan, "KANSYS: A CAD tool for analog circuit synthesis," in *Proceedings of the $9^{th}$ International Conference on VLSI Design*, 1996, pp. 333–334.

These methods have several disadvantages. They find a locally optimal design (or, even just a "good" or "reasonable" design) instead of a globally optimal design. The final design depends on the initial design chosen and the algorithm parameters. As with classical optimization methods, infeasibility is not unambiguously detected; the method simply fails to find a feasible design (even when one may exist). Also, these methods require substantial human intervention either during the design process, or during the training process.

Optimization methods that determine globally optimal designs have also been developed for analog circuit design. Two widely known global optimization methods are branch and bound and simulated annealing. Branch and bound methods are iterative methods. In each iteration a suboptimal feasible design and also a lower bound on the achievable performance is maintained. This enables the algorithm to terminate with a global design within a given tolerance. A disadvantage of branch and bound methods is that they are extremely slow, and computation requirements grow exponentially with the size of the optimization problem. Even problems with ten variables can be extremely challenging.

Simulated annealing is another method which can in theory compute a globally optimal design, however, no real-time lower bound is available, so termination is heuristic. See for instance, D. F. Wong, H. W. Leong, and C. L. Liu, *Simulated Annealing for VLSI design, Kluwer*, 1988;

P. J. M. van Laarhoven and E. H. L. Aarts, *Simulated Annealing: Theory and Applications*, D. Reidel, 1987;

E. S. Ochotta, R. A. Rutenbar, and L. R. Carley, "Synthesis of high-performance analog circuits in ASTRX/OBLX," *IEEE Transactions on Computer-Aided Design*, vol.15, pp. 273–293, March 1996;

G. G. E. Gielen, H. C. C. Walscharts, and W. M. C. Sansen, "Analog circuit design optimization based on symbolic simulation and simulated annealing," *IEEE Journal of Solid-State Circuits*, vol. 25, pp. 707–713, June 1990; and H. Z. Yang, C. Z. Fan, H. Wang, and R. S. Liu, "Simulated annealing algorithm with multi-molecule: an approach to analog syntheses," in *Proceedings of the 1996 European Design & Test Conference*, 1996, pp. 571–575. The main disadvantages of simulated annealing are that it can be very slow, and that it cannot in practice guarantee a globally optimal solution.

The thermal logic synthesizer (TILOS) optimization system applies geometric programming to digital circuit design, and more specifically to transistor and wire sizing for Elmore delay minimization, as described in U.S. Pat. No. 4,827,428. The geometric programs that arise in Elmore delay minimization are very specialized (the only exponents that arise are 0 and ±1). Furthermore, the representation of the problem as a geometric program is only approximate (since the actual circuits are nonlinear, and the threshold delay, not Elmore delay, is the true objective).

Thus an improved optimization system that quickly generates globally optimal designs for a wide range of performance specifications, and readily scales with many variable problems would be highly desirable.

SUMMARY OF THE INVENTION

In summary, the present invention is a CAD system for designing and optimizing integrated circuits. The present invention provides automated synthesis of globally optimal circuit designs for a given circuit topology library, directly from user defined specifications. The CAD system includes a library of integrated circuit topologies. The performance specifications for the integrated circuit topologies are described as posynomial functions of the design parameters. The performance specifications are combined with user defined design objectives and constraints to form a geometric program. One embodiment reformulates geometric programs as convex optimization problems, i.e., the problem of minimizing a convex function subject to convex inequalities constraints and linear equality constraints. This facilitates globally and efficiently solving geometric programs. New variables $y_i = \log x_i$ are defined, the logarithm of a posynomial $f$ is taken to get $$h(y) = \log(f(e^{y_1}, \ldots, e^{y_n})) = \log\left(\sum_k^t e^{a_k^T y + b_k}\right)$$

where $a_k^T = [\alpha_{1k} \ldots \alpha_{nk}]$ and $b_k = \log c_k$. It can be shown that h is a convex function of the new variabley: for all y, $z \in R^n$ and $0 \leq \lambda \leq 1$ which yields $h(\lambda y + (1-\lambda)z) \leq \lambda h(y) + (1-\lambda) h(z)$.

The geometric program is then expressed as convex program as follows:

minimize $\log f_0(e^{y_1}, \ldots, e^{y_n})$ subject to $\log f_i(e^{y_1}, \ldots, e^{y_n}) \leq 0$, i=1, ..., m $\log g_i(e^{y_1}, \ldots, e^{y_n}) = 0$, i=1, ..., p.

This is the so-called exponential form of the geometric program. The convexity of the exponential form geometric program has several important implications including that efficient interior-point methods can be used to solve such geometric programs, and there is a complete and useful duality, or sensitivity theory for them. The solution to the geometric program is a globally optimal design of the integrated circuit topology for the defined specification values. The efficient procedures for solving geometric programs typically provide the globally optimal results in a matter of seconds. The present invention therefore yields automated synthesis of globally optimal circuit designs for a given circuit topology library, directly from specifications.

One embodiment includes an op-amp optimization tool. The op-amp optimization tool can be used to optimize a wide range of op-amp performance specifications and constraints including power, open-loop gain, and bandwidth.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENTS

The present invention is a CAD system that provides automated synthesis of globally optimal circuit designs for a given circuit topology library, directly from user defined specifications. The present invention optimizes circuit designs by modelling circuit operation using posynomial functions. The most important feature of geometric programs is that the globally optimal solution can be computed with great efficiency, even for problems with hundreds of variables and thousands of constraints, using recently developed interior-point methods. Thus, even challenging circuit design problems with many variables and constraints can be (globally) solved.

The fact that geometric programs (and hence, circuit design problems cast as geometric programs) can be globally solved has a number of important consequences. The first is that sets of infeasible specifications are unambiguously recognized: the method either produces a feasible point or a proof that the set of specifications is infeasible. Indeed, the choice of initial design for the optimization procedure is completely irrelevant (and can even be infeasible); it has no effect on the final design obtained. Since the global optimum is found, the circuits obtained are the best any method can design (with the same specifications) for a given circuit topology and technology parameters.

The fact that geometric programs can be solved very efficiently has a number of practical consequences. For example, the method can be used to simultaneously optimize the design of a large number of op-amps in a single large mixed mode integrated circuit. In this case the designs of the individual op-amps are coupled by constraints on total power and area, and by various parameters that affect the amplifier coupling such as input capacitance, output resistance, etc. Another application is to use the efficiency to obtain robust designs, i.e., designs that are guaranteed to meet a set of specifications over a variety of processes or technology parameter values. This is done by simply replicating the specifications with a (possibly large) number of representative process parameters, which is practical only because geometric programs with thousands of constraints are readily solved.

Figure 1:
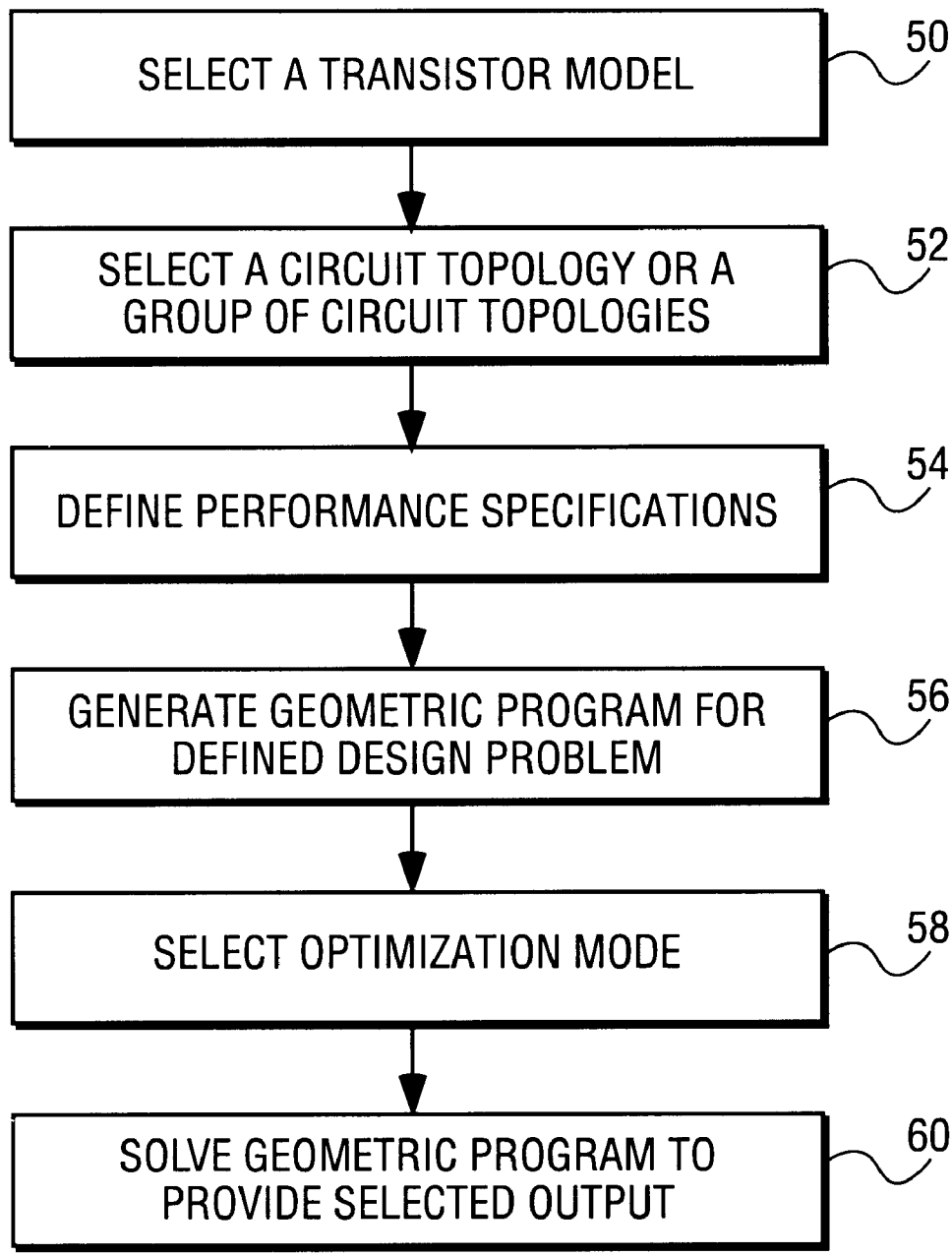
FIG. 1 illustrates a flow chart of a globally optimal circuit design and optimization method according to an embodiment of the present invention.

Referring to FIG. 1, there is shown a flow chart of a globally optimal circuit design and optimization method according to an embodiment of the present invention. The present invention can be implemented as a digital and analog integrated circuit CAD system. When a new semiconductor manufacturing process is initialized on the CAD system of the present invention, models for the transistors in the process are generated. The system may include posynomial transistor models of different levels of complexity that can be selected as needed based on the design requirements, step 50. In one MOS transistor embodiment long channel square law MOS models are used as described in P. R. Gray and R. G. Meyer, *Analysis and Design of Analog Integrated Circuits*, 3rd. Edition 1993.

The CAD system includes a library of circuit topologies. The library is divided into groups containing pre-defined circuit topologies for a large number of devices, including, for example: CMOS op-amps, amplifiers for automatic gain control, limiters, oscillators, RF amplifiers (LNA, shunt-peaked), and inductors/transformers. For digital circuit design the present invention can be used to optimize logic gates and buffers and thereby to optimize the performance of digital logic devices. The present invention can generally be applied to optimize any type of integrated circuit performance specification that can be expressed in posynomial form. Users of the CAD system can develop proprietary device topologies to augment existing device libraries.

After a transistor model has been selected, the next step in designing or optimizing a circuit is to select a circuit topology or a group of circuit topologies, step 52. A user then selects performance specifications for the desired device, such as an op-amp, step 54. The system generates a geometric program using posynomial or monomial expressions for the defined performance specifications, step 56. The user can select one of three optimization modes. The first mode is a standard optimization mode in which one or more performance specifications are optimized subject to a set of constraints. The second mode is a robust design mode in which in addition to the standard optimization there is an additional constraint that the design should work under several process conditions. The third mode is a trade-off curve mode. In this mode the optimization problem is repeatedly solved as the system sweeps over the range of selected constraint limits. The output in this mode is a series of curves displaying the trade-offs of the different constraint values. For example, for an op-amp, a user can repeatedly minimize power as the system sweeps the value of the minimum required unity-gain bandwidth, and holds constant all the other constraints. The resulting curve shows the globally optimal trade-off between unity-gain bandwidth and power (for the values of the other limits). The system solves the geometric program to provide the desired results, step 60. The solution provided is the globally optimal solution for the defined performance specifications. If a user selected a group of circuit topologies the system can rapidly perform the optimization analysis on each circuit topology to select the optimal circuit topology.

To include performance specifications in the geometric program optimization process, the specifications must be expressed in monomial or posynomial form. The CAD system includes monomial or posynomial expressions for standard performance specifications of the circuit topologies in the system library. Performance specifications that cannot be directly expressed in monomial or posynomial form are expressed by monomial or posynomial approximations. A symbolic analyzer can be incorporated into the CAD system to generate monomial or posynomial expressions for performance specifications. Examples of such symbolic analyzers include ISAAC which is described by G. G. E. Gielen, H. C. C. Walscharts, and W. M. C. Sansen in "ISAAC: a Symbolic Simulator for Analog Integrated Circuits," IEEE Journal of Solid-State Circuits, 24:1587–1597, December 1989, which is hereby incorporated by reference, and SYNAP which is described by S. J. Seda, M. G. R. Degrauwe, and W. Fichtner in "A Symbolic Tool for Analog Circuit Design Automation," Digest of Technical Papers IEEE International Conference on Computer-Aided Design, pages 488–491, 1988, which is hereby incorporated by reference. In addition, users can provide their own monomial or posynomial approximations tailored to particular applications.

Figure 2:
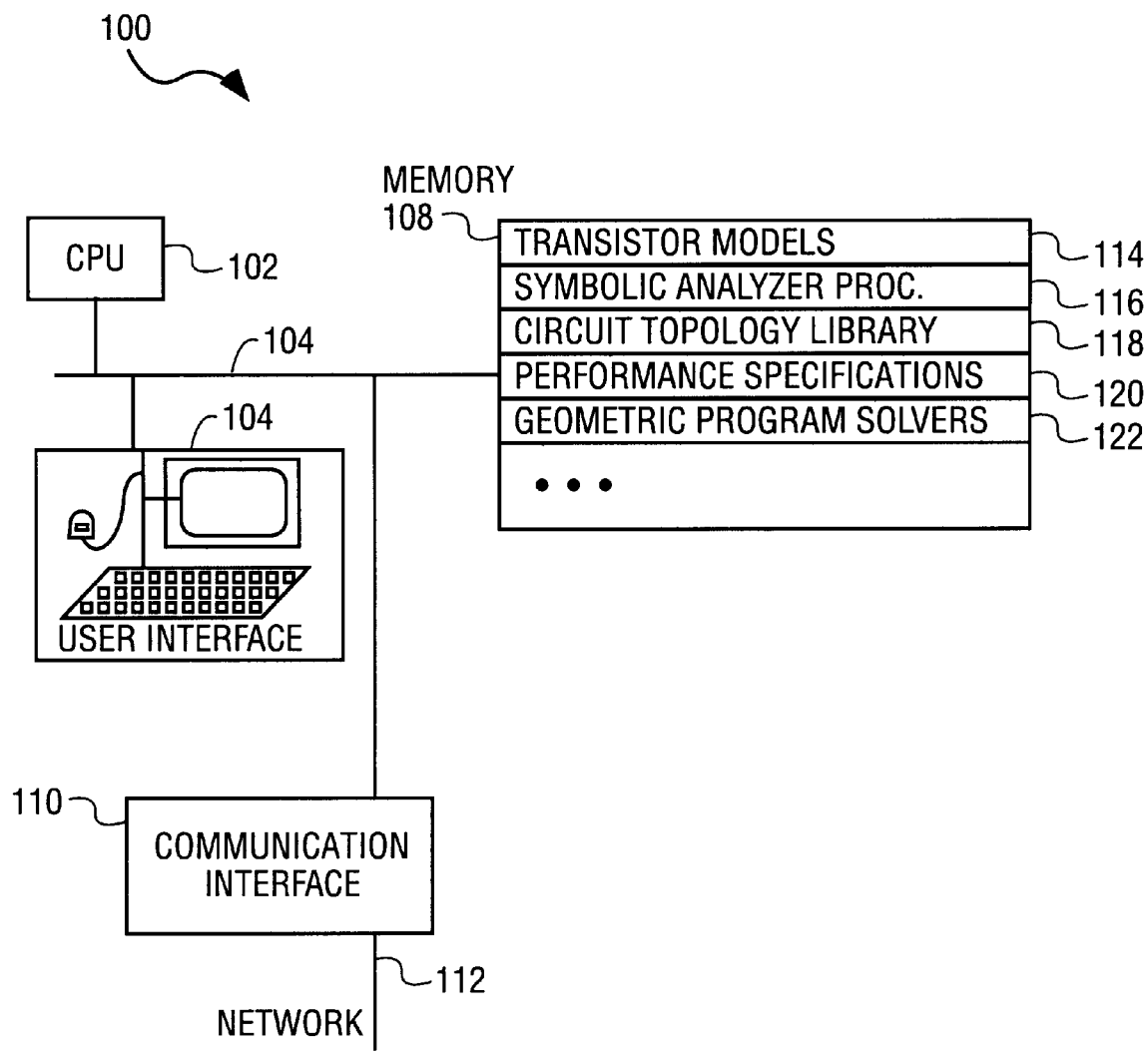
FIG. 2 is a block diagram of a computer system incorporating a preferred embodiment of the integrated circuit design and optimization system of the present invention.

Referring to FIG. 2, there is shown a computer system or workstation 100 that incorporates a preferred embodiment of the present invention. The system 100 includes a central processing unit 102, internal system, control and data busses 106, memory 108 (including random access memory as well as non-volatile memory such as magnetic disk storage), a user interface 104, and a communications interface 110 for transferring information to and from other devices via one or more communication channels 112.

Memory 108 stores both computer software and data, which represents a software module having instructions for performing the steps shown in FIG. 1, including:

transistor models 114;
symbolic analyzer procedure 116;
circuit topology library 118;
performance specifications expressed in a form that can be used in a geometric program 120; and
geometric program solvers 122.

GEOMETRIC PROGRAMMING

The present invention optimizes circuit designs by modelling circuit operation using geometric programs and solving the geometric programs to provide the optimal design parameter values. A geometric program is a form of an optimization problem and is defined using posynomial and monomial functions. Let $x_1, \ldots, x_n$ be n real, positive variables. The vector $(x_1, \ldots, x_n)$ of these variables is herein denoted as x. A function $f$ is called a posynomial function of x if it has the form $$f(x_1, \ldots, x_n) = \left( \sum_{k=1}^{t} c_k x_1^{\alpha_{1k}} x_2^{\alpha_{2k}} \ldots x_n^{\alpha_{nk}} \right)$$

where $c_j \leq 0$ and $\alpha_{ij}$ is a real number. Note that the coefficients $c_k$ must be nonnegative, but the exponents $\alpha_{ij}$ can be any real numbers, including negative or fractional. When there is only one term in the sum, i.e., t=1, $f$ is called a monomial function. (Note that this terminology differs from the standard definition of a monomial in algebra.) Thus, for example, $0.7 + 2x_1/x_3^2 + x_2^{0.3}$ is posynomial (but not monomial); $2.3(x_1/x_2)^{1.5}$ is a monomial (and, therefore, also a posynomial); while $2x_1/x_3^2 - x_2^{0.3}$ is neither. Note that posynomials are closed under addition, multiplication, and nonnegative scaling. Monomials are closed under multiplication and division.

A geometric program is an optimization problem of the form minimize $f_0(x)$ subject to $f_i(x) \leq 1$, i=1, ..., m,     (1)

$g_i(x)=1$, i=1, ..., p, $x_i > 0$, i=1, ..., n, where $f_1, \ldots, f_m$ are posynomial functions and $g_1, \ldots, g_p$ are monomial functions.

Several extensions are readily handled. If $f$ is a posynomial and g is a monomial, then the constraint $f(x) \leq g(x)$ can be handled by expressing it as $f(x)/g(x) \leq 1$ (since $f/g$ is posynomial). For example, constraints of the form $f(x) \leq a$ can be handled, where $f$ is posynomial and a>0. In a similar way if $g_1$ and $g_2$ are both monomial functions, then the equality constraint $g_1(x)=g_2(x)$ can be handled by expressing it as $g_1(x)/g_2(x)=1$ (since $g_1/g_2$ is monomial).

There are also functions whose reciprocals are posynomials. A function, h, is called an inverse posynomial if $1/h$ is a posynomial. If h is an inverse posynomial and $f$ is a posynomial, then geometric programming can handle the constraint $f(x) \leq h(x)$ by writing it as $f(x)(1/h(x)) \leq 1$. As another example, if h is an inverse posynomial, then it can be maximized, by minimizing the posynomial $1/h$. As defined herein the term posynomial includes monomial and inverse posynomial functions.

Geometric Programming in Convex Form

The present invention reformulates geometric programs as convex optimization problems, i.e., the problem of minimizing a convex function subject to convex inequalities constraints and linear equality constraints. This facilitates globally and efficiently solving geometric programs. New variables $y_i = \log x_i$ are defined, the logarithm of a posynomial $f$ is taken to get $$h(y) = \log(f(e^{y_1}, \ldots, e^{y_n})) = \log\left( \sum_{k}^{t} e^{a_k^T y + b_k} \right)$$

where $a_k^T = [\alpha_{1k} \ldots \alpha_{nk}]$ and $b_k = \log c_k$. It can be shown that h is a convex function of the new variable y: for all y, $z \in R^n$ and $0 \leq \lambda \leq 1$ which yields $h(\lambda y + (1-\lambda)z) \leq \lambda h(y) + (1-\lambda)h(z)$.

Note that if the posynomial $f$ is a monomial, then the transformed function h is affine, i.e., a linear function plus a constant. The standard geometric program (1) can then be converted into a convex program by expressing it as minimize $\log f_0(e^{y_1}, \ldots, e^{y_n})$ subject to $\log f_i(e^{y_1}, \ldots, e^{y_n}) \leq 0$, i=1, ..., m     (2)

$\log g_i(e^{y_1}, \ldots, e^{y_n})=0$, i=1, ..., p.

This is the so-called exponential form of the geometric program (1). The convexity of the exponential form geometric program (2) has several important implications: efficient interior-point methods can be used to solve such geometric programs, and there is a complete and useful duality, or sensitivity theory for them.

Solving Geometric Programs

Efficient interior point methods to solve geometric programs have recently been developed. One such method is described by K. O. Kortanek, X. Xu, and Y. Ye, "An Infeasible Interior-point Algorithm for Solving Primal and Dual Geometric Programs," MathProgramming, 76:155–181, 1996, which is hereby incorporated by reference. This method has the desirable feature of exploiting sparsity in the problem, i.e., efficiently handling problems in which each variable appears in only a few constraints. Additional methods of solving geometric programs are described in: Y. Nesterov and A. Nemirovsky, "Interior-Point Polynomial Methods in Convex Programming," Vol. 13 of Studies in Applied Mathematics. SIAM, Philadelphia, Pa., 1994; and A. Fiacco and G. McCormick, *Nonlinear-Programming: Sequential Unconstrained Minimization Techniques*, Wiley 1968 (Reprinted in SIAM Classics In Applied Mathematics series 1990) which are hereby incorporated by reference.

For the purposes of the present invention, the most important feature of geometric programs is that they can be globally solved with great efficiency. Problems with hundreds of variables and thousands of constraints are readily handled, on a small workstation, in minutes; problems which have a few tens of variables and fewer than 100 constraints, are easily solved in under one second. A primal barrier method can be used to solve the exponential form problem. In one embodiment, using a primal only method without exploiting sparsity, and with the overhead of an interpreted language, the geometric programs arising in an op-amp design example discussed below were all solved in approximately one to two seconds on an ULTRA SPARC1, 170 MHz. The efficiency of the method can be increased by using a C implementation of a primal-dual method.

Perhaps even more important than the great efficiency is the fact that the present invention geometric programming method always obtains the global minimum. Infeasibility is unambiguously detected: if the problem is infeasible, then the method determines this fact. This is in contrast to conventional optimization systems that just fail to find a feasible point.

Another benefit of the global solution is that the initial starting point is irrelevant, the same global solution is found no matter what the initial starting point is.

Sensitivity Analysis

For sensitivity analysis purposes the right-hand sides of the constraints in the geometric program (1) are modified as follows:

minimize $f_0(x)$ subject to $f_i(x) \leq e^{u_i}$, $i=1, \ldots, m$, (3)

$g_i(x) = e^{v_i}$, $i=1, \ldots, p$, $x_i > 0$, $i=1, \ldots, n$.

If all of the $u_i$ and $v_i$ are zero, this modified geometric program coincides with the original one. If $u_i < 0$, then the constraint $f_i(x) \leq e_i^u$ represents a tightened version of the original ith constraint $f_i(x) \leq 0$; conversely if $u_i > 0$, it represents a loosening of the constraint. Note that $u_i$ gives a logarithmic or fractional measure of the change in the specification: $u_i = 0.0953$ means that the ith constraint is loosened 10%, whereas $u_i = -0.0953$ means that the ith constraint is tightened 10%.

Let $f_0(u, v)$ denote the optimal objective value of the modified geometric program (3), as a function of the parameters $u = (u_i, \ldots, u_m)$ and $v = (v_i, \ldots, v_p)$, so the original objective value is $f_0(0, 0)$. In a sensitivity analysis, the variation of $f_0$ as a function of u and v is provided, for small u and v. To express the change in optimal objective function in a fractional form, one embodiment of the present invention uses the logarithmic sensitivities $$S_i = \frac{\partial \log f_0^*}{\partial u_i}, T_i = \frac{\partial \log f_0^*}{\partial v_i},$$ (4)

evaluated at u=0, v=0. These sensitivity numbers are dimensionless, since they express fractional changes per fractional change.

For simplicity this embodiment assumes that the original geometric program is feasible, and remains feasible for small changes in the right-hand sides of the constraints, and also that the optimal objective value is differentiable as a function of $u_i$ and $v_i$. The sensitivity numbers $S_1, \ldots, S_m$ and $T_1, \ldots, T_p$ are provided, when the problem is solved using an interior-point method from the solution of the dual problem.

Observe that if at the optimal solution x* of the original problem, the ith inequality constraint is not active, i.e., $f_i(x^*)$ is strictly less than one, then $S_i = 0$ (since the ith constraint can be slightly tightened or loosened with no effect). Furthermore, $S_1$ is always $\leq 0$, since increasing $u_i$ slightly loosens the constraints, and hence lowers the optimal objective value. The sign of $T_i$ indicates whether increasing the right-hand side of the equality constraint $g_i = 1$ increases or decreases the optimal objective value.

The sensitivity numbers are extremely useful, and give tremendous insight to the designer. Suppose, for example, that the objective $f_0$ is power dissipation, $f_1(x) \leq 1$ represents the constraint that the bandwidth is at least 30 MHz, and $g_1(x) = 1$ represents the constraint that the open-loop gain is $10^5$ V/V. Then Si=−3, say, indicates that a small fractional increase in required bandwidth will translate into a three times larger fractional increase in power dissipation. $T_1 = 0.1$ indicates that a small fractional increase in required open-loop gain will translate into a fractional increase in power dissipation only one-tenth as big. Although both constraints are active, the sensitivities indicate that the design is, roughly speaking, more tightly constrained by the bandwidth constraint than the open-loop gain constraint. The sensitivity information from the example above might lead the designer to reduce the required bandwidth (to reduce power), or perhaps increase the open-loop gain.

SAMPLE APPLICATION TO A TWO-STAGE AMPLIFIER

Figure 3:
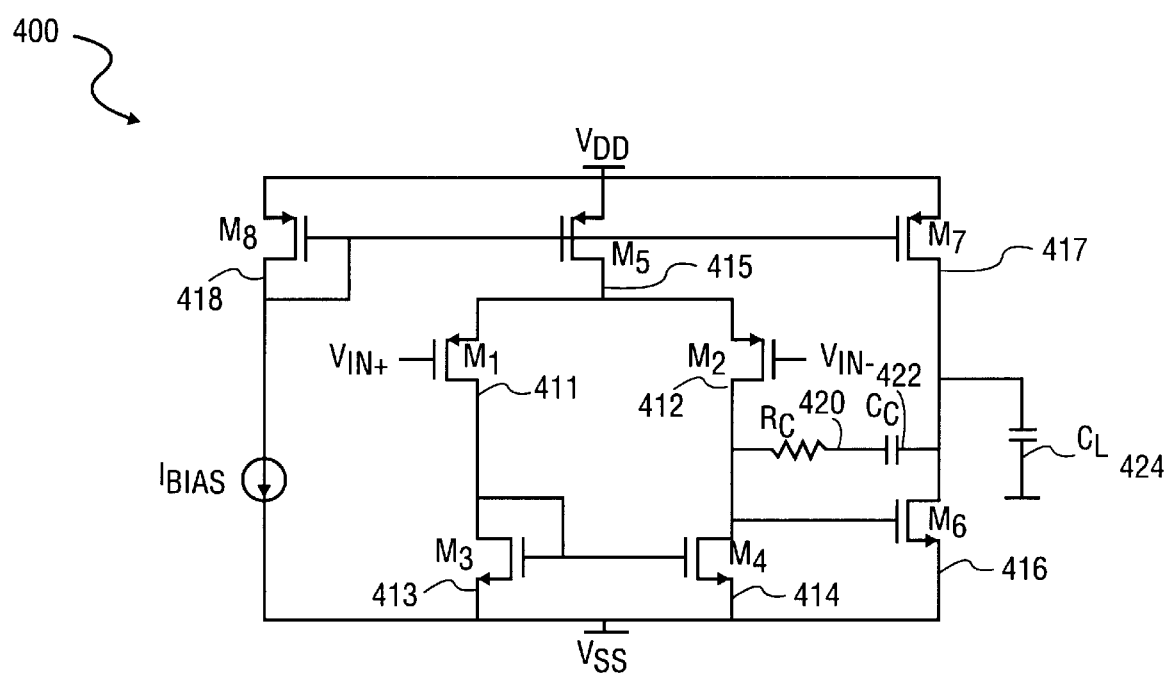
FIG. 3 illustrates a two-stage CMOS op-amp.

Referring to FIG. 3, there is shown a two-stage CMOS op-amp 400. The op-amp 400 is used to illustrate a sample application of the integrated circuit design and optimization system of the present invention. The present invention comprises a flexible design tool applicable to a wide range of digital and analog circuits, the sample application to the two-stage op-amp 400 is only a detailed illustrative example. This op-amp is a widely used general purpose op-amp, it finds applications for example in switched capacitor filters, analog to digital converters, and sensing circuits. The op-amp circuit consists of an input differential stage with active load followed by a common-source stage also with active load. An output buffer is not used; this amplifier is assumed to be part of a VLSI system and is only required to drive a fixed on-chip capacitive load of a few picofarads. This op-amp architecture has many advantages: high open-loop voltage gain, rail-to-rail output swing, large common-mode input range, only one frequency compensation capacitor, and a small number of transistors. Its main drawback is the nondominant pole formed by the load capacitance and the output impedance of the second stage, which reduces the achievable bandwidth. Another potential disadvantage is the right half plane zero that arises from the feedforward signal path through the compensating capacitor. Fortunately the zero is easily removed by a suitable choice for the compensation resistor $R_c$ 420.

There are eighteen design parameters for the two-stage op-amp:

The widths and lengths of all of the MOS transistors, i.e., $W_1, \ldots, W_8$ and $L_1, \ldots, L_8$;

The bias current $I_{bias}$; and

The value of the compensation capacitor $C_c$.

The compensation resistor $R_c$ 420 is chosen in a specific way that is dependent on the design parameters listed above (and described in the Small Signal Transfer Function Constraints section below). There are also a number of parameters that are considered fixed, e.g., the supply voltages $V_{DD}$ and $V_{SS}$, the capacitive load $C_L$ 424, and the various process and technology parameters associated with the MOS models.

Given the op-amp topology 400, the design problem consists of determining the sizes (widths and lengths) of all transistors, the values of the compensating network (resistor $R_c$ 420 and capacitor $C_c$ 422) and the value of the reference current. There are many specifications for an op-amp. An illustrative example of op-amp specifications that can be optimized using the present invention include the following:

Area

Gate overdrive

Quiescent power

Open loop gain

Dominant pole conditions 3 dB bandwidth

Unity-gain bandwidth

Phase margin

Slew rate

Common-mode rejection ratio

Negative power supply rejection ratio

Input-referred spot noise

Input-referred total noise subject to a combination of the following constraints:

Symmetry and matching

Limit on the device sizes

Area

Systematic offset voltage

Bias conditions (transistor must remain in saturation)

Common-mode input range

Output voltage swing

Gate overdrive

Quiescent power

Open loop gain

Dominant pole conditions 3 dB bandwidth

Unity-gain bandwidth

Phase margin

Slew rate

Common-mode rejection ratio

Negative power supply rejection ratio

Input-referred spot noise

Input-referred total noise

Equations for each of these performance specifications are described below. To conform to geometric program requirements some of the performance specifications are approximated.

DIMENSION CONSTRAINTS

The following sections illustrate op-amp performance specifications and defines them in posynomial form for use in the geometric program based optimization system of the present invention. First some very basic constraints involving the device dimensions, e.g., symmetry, matching, minimum or maximum dimensions, and area limits are described.

Symmetry and Matching

Referring to FIG. 3, for the input differential pair to operate as intended, MOS transistors $M_1$ 411 and $M_2$ 412 should be identical and transistors $M_3$ 413 and $M_4$ 414 should also be identical. These conditions translate into the four equality constraints:

$$W_1=W_2, L_1=L_2, W_3=W_4, L_3=L_4 \qquad (5)$$

Also, the biasing transistors $M_5$ 415, $M_7$ 417, and $M_8$ 418 should match, i.e., have the same length:

$$L_5=L_7=L_8 \qquad (6)$$

The six equality constraints in (5) and (6) have monomial expressions on the left and right hand sides, hence are readily handled in geometric programming by expressing them as monomial equality constraints such as $W_1/W_2=1$.

Limits on Device Sizes

Lithography limitations and layout rules impose minimum (and possibly maximum) sizes on the transistors:

$$L_{min} \leq L_i \leq L_{max}, W_{min} \leq W_i \leq W_{max}, i=1, \ldots 8. \qquad (7)$$

These 32 constraints can be expressed as posynomial constraints such as $L_{min}/L_1 \leq 1$, etc. Since $L_i$ and $W_i$ are variables (hence, monomials), certain devices sizes can also be fixed, i.e., equality constraints can be imposed.

Area

The op-amp 400 die area A can be approximated as a constant plus the sum of transistor and capacitor area as $$A = \alpha_0 + \alpha_1 C_c + \alpha_2 \sum_{i=1}^{8} W_i L_i. \qquad (8)$$

Here $\alpha_0 \geq 0$ gives the fixed area, $\alpha_1 > 1$ is the ratio of capacitor area to capacitance, and the constant $\alpha_2 > 1$ (if it is not one) can take into account wiring in the drain and source area. This expression for the area is a posynomial function of the design parameters, so an upper bound can be imposed on the area, i.e., $A \leq A_{max}$, or the area can be used as the objective to be minimized. More accurate posynomial formulas for the amplifier die area can be developed, if needed.

Systematic Input Offset Voltage

To reduce input offset voltage, the drain voltages of $M_3$ 413 and $M_4$ 414 should be equal, ensuring that the current $I_5$ is split equally between transistors $M_1$ 411 and $M_2$ 412. This happens when the current densities of $M_3$ 413, $M_4$ 414, and 416 are equal, i.e., $$\frac{W_3/L_3}{W_6/L_6} = \frac{W_4/L_4}{W_6/L_6} = \frac{1}{2}\frac{W_5/L_5}{W_7/L_7}. \qquad (9)$$

These two conditions are equality constraints between monomials, and are therefore readily handled by geometric programming.

Bias Conditions, Signal Swing, and Power Constraints

In this section constraints involving bias conditions are described, including the effects of common-mode input voltage and output signal swing. The quiescent power of the op-amp, as determined, by the bias conditions, is also addressed. In deriving these constraints, the symmetry and matching conditions (5) and (6) are assumed to hold. To derive the equations a standard long channel, square-law model for the MOS transistors is used, as is well known by those of ordinary skill in the art.

In order to simplify the equations, it is convenient to define the bias currents $I_1$, $I_5$, and $I_7$ through transistors $M_1$ 411, $M_5$ 415 and $M_7$ 417, respectively. Transistors $M_5$ 415 and $M_7$ 417 form a current mirror with transistor $M_8$ 418. Their currents are given by $$I_5 = \frac{W_5 L_8}{L_5 W_8} I_{bias}, I_7 = \frac{W_7 L_8}{L_7 W_8} I_{bias}, \qquad (10)$$

Thus $I_5$ and $I_7$ are monomials in the design variables. The current through transistor $M_5$ 415 is split equally between transistor $M_1$ 411 and $M_2$ 412. Thus $I_1$ can be expressed as $$I_1 = \frac{I_5}{2} = \frac{W_5 L_8}{2 L_5 W_8} I_{bias}, \qquad (11)$$

which is another monomial.

Since these bias currents are monomials, lower or upper bounds on them can be included in the geometric program, or even equality constraints. $I_1$, $I_5$, and $I_7$ are used to express other constraints, although it should be observed that these bias currents can simply be eliminated (i.e., expressed directly in terms of the design variables) using (10) and (11).

Bias Conditions

The setup for deriving the bias conditions is as follows. The input terminals are at the same DC potential, the common-mode input voltage $V_{cm}$. the common-mode input voltage is assumed to be allowed to range between a minimum value $V_{cm,min}$ and a maximum value $V_{cm,max}$, which are given. Similarly, the output voltage is assumed to be allowed to swing between a minimum value $V_{out,min}$ and a maximum value $V_{out,max}$ (which takes into account large signal swings in the output).

The bias conditions are that each transistor $M_1$ 411, ..., $M_8$ 418 should remain in saturation for all possible values of the input common-mode voltage and the output voltage. The important point here is that the constraints are each posynomial inequalities of the design variables, and hence can be handled by geometric programming.

Transistor $M_1$ 411. The lowest common-mode input voltage, $V_{cm,mim}$, imposes the toughest constraint on transistor $M_1$ 411 remaining in saturation. The condition is:

$$\sqrt{\frac{I_1 L_3}{\mu_n C_{ox}/2W_3}} \leq V_{cm,min} - V_{ss} - V_{TP} - V_{TN} \quad (12)$$

Transistor $M_2$ 412. The systematic offset condition (9) makes the drain voltage of $M_1$ 411 equal to the drain voltage of $M_2$ 412. Therefore, the condition for $M_2$ 412 being saturated is the same as the condition for $M_1$ 411 being saturated, i.e., (12). Note that the minimum allowable value of $Vat_{cm,min}$ is determined by $M_1$ 411 and $M_2$ 412 entering the linear region.

Transistor $M_3$ 413. Since $V_{gd,3}=0$ transistor $M_3$ 413 is always in saturation and no additional constraint is necessary.

Transistor $M_4$. The systematic offset condition also implies that the drain voltage of $M_4$ 414 is equal to the drain voltage of $M_3$ 413. Thus $M_4$ 414 will be saturated as well.

Transistor $M_5$. The highest common-mode input voltage, $V_{cm,max}$, imposes the tightest constraint on transistor $M_5$ 415 being in saturation. The condition is:

$$\sqrt{\frac{I_1 L_1}{\mu_p C_{ox}/2W_1}} + \sqrt{\frac{I_5 L_5}{\mu_p C_{ox}/2W_5}} \leq V_{dd} - V_{cm,max} + V_{TP} \quad (13)$$

Thus, the maximum allowable value of $V_{cm,min}$ is determined by $M_5$ 415 entering the linear region.

Transistor $M_6$. The most stringent condition occurs when the output voltage is at its minimum value $V_{out,min}$:

$$\sqrt{\frac{I_7 L_6}{\mu_n C_{ox}/2W_6}} \leq V_{dd} - V_{out,min} - V_{ss} \quad (14)$$

Transistor $M_7$. For $M_7$, the most stringent condition occurs when the output voltage is at its maximum value $V_{cm,max}$:

$$\sqrt{\frac{I_7 L_7}{\mu_p C_{ox}/2W_7}} \leq D_{dd} - V_{out,max}, \quad (15)$$

Transistor $M_g$. Since $V_{gd,8}=0$, transistor $M_8$ 418 is always in saturation; no additional constraint is necessary.

In summary, the requirement that all transistors remain in saturation for all values of common-mode input voltage between $V_{cm,min}$ and $V_{cm,max}$, and all values of output voltage between $V_{cm,min}$ and $V_{cm,max}$, is given by the four inequalities (12), (13), (14), and (15). These are posynomial constraints on the design parameters.

Gate Overdrive

It is sometimes desirable to operate the transistors with a minimum gate overdrive voltage. This ensures that the transistors operate away from the subthreshold region, and also improves matching between transistors. For any given transistor this constraint can be expressed as:

$$V_{gs} - V_T = \sqrt{\frac{I_D L}{\mu C_{ox}/2W}} \geq V_{overdrive,min}. \quad (16)$$

The expression on the left is a monomial, so an upper bound can also be imposed on it, or an equality constraint. As described below, robustness to process variations can be dealt with in a more direct way.

Quiescent Power

The quiescent power of op-amp 400 is given by $$p=(V_{dd}-V_{ss})(I_{bias}+I_5+I_7), \quad (17)$$

which is a posynomial function of the design parameters. Hence an upper bound can be imposed on P, or it can be used as the performance specification to be minimized.

SMALL SIGNAL TRANSFER FUNCTION DESIGN CONSTRAINTS

Small Signal Transfer Function

The symmetry, matching, and bias constraints are now assumed to be satisfied, and the (small signal) transfer function H from a differential input source to the output is addressed. To derive the transfer function H, a standard small signal model for the transistors is used. The standard value of the compensation resistor is used, i.e., $$R_c=1/g_{m6} \quad (18)$$

The transfer function can be well approximated by a four pole form $$H(s) = A_v \sqrt{\frac{1}{(1+s/p_1)(1+s/p_2)(1+s/p_3)(1+s/p_4)}}. \quad (19)$$

Here $A_v$ is the open-loop voltage gain, $-p_1$ is the dominant pole, $-p_2$ is the output pole, $-p_3$ is the mirror pole, and $-p_4$ is the pole arising from the compensation circuit, respectively. In order to simplify the description, hereinafter, the poles are referred to as $p_1 \ldots, p_4$, which are positive (whereas precisely speaking, the poles are $-p_1 \ldots, -p4$).

The expressions for the gain and poles are now described.

The open-loop voltage gain is $$A_v = \left(\frac{g_{m2}}{g_{o2}=g_{o4}}\right)\left(\frac{g_{m6}}{g_{06}+g_{07}}\right) = \frac{2C_{ox}}{(\lambda_n+\lambda_p)^2}\sqrt{\mu_n \mu_p \frac{W_2 W_6}{L_2 L_6 I_1 I_7}}, \quad (20)$$

which is monomial function of the design parameters.

The dominant pole is accurately given by $$p_1 = \frac{g_{m1}}{A_v C_c}. \quad (21)$$

Since $A$, and $g$, are monomials, and $C_c$ is a design variable, $p_1$ is a monomial function of the design variables.

The output pole $p_2$ is given by $$p_2 = \frac{g_{m6}C_c}{C_1C_c = C_1C_{TL} + C_cC_{TL}} \quad (22)$$

where $C_1$, the capacitance at the gate of $M_6$ 416, can be expressed as $$C_1 = c_{gs6} + C_{db2} + C_{db4} + C_{gd2} + C_{gd4}. \quad (23)$$

and $C_L$, the total capacitance at the output node, can be expressed as $$C_{TL} = C_L + C_{db6} + C_{db7} + C_{gd6} + C_{gd7} \quad (24)$$

The important point here is that $p_2$ is an inverse posynomial function of the design parameters (i.e., $1/p_2$ is a posynomial).

The mirror pole $p_3$ is given by $$p_3 = \frac{g_{m3}}{C_2} \quad (25)$$

where $C_2$, the capacitance at the gate of $M_3$ 413, can be expressed as $$C_2 = C_{gs3} + C_{gs4} + C_{db1} + C_{db3} + C_{gd1}. \quad (26)$$

Thus, p3 is also an inverse posynomial.

The compensation pole is $$p_4 = \frac{g_{m6}}{C_1}, \quad (27)$$

which is also inverse posynomial.

In summary: the open-loop gain $A_v$ and the dominant pole $p_1$ are monomial, and the parasitic poles $p_2$, $p_3$, and $p_4$ are all inverse posynomials. Next various design constraints and specifications that involve the transfer function are described.

Open-Loop Gain Constraints

Since the open-loop gain $A_v$ is a monomial, it can be constrained to equal some desired value $A_{des}$. Upper or lower bounds can also be imposed on the gain, as in $$A_{min} \leq A_v \leq A_{max} \quad (28)$$

where $A_{min}$ and $A_{max}$ are given lower and upper limits on acceptable open-loop gain.

Minimum Gain at a Frequency

The magnitude squared of the transfer function at a frequency $\omega_0$ is given by $$|H(j\omega_0)|^2 = \frac{A_v^2}{\prod_{i=1}^{4}(1+\omega_0^2/p_i^2)}.$$

Since $p_i$ are all inverse posynomial, the expressions $\omega_0^2/p_i^2$ are posynomial. Hence the whole denominator is posynomial. The numerator is monomial, therefore the squared magnitude of the transfer function, $|H(j\omega_0)|^2$, is inverse posynomial. (Indeed, it is inverse posynomial in the design variables and $\omega_0$ as well.) Therefore any constraint of the form $$|H(j\omega_0)| \geq a$$

can be imposed using geometric programming (by expressing it as $a^2/|H(j\omega_0)|^2 \leq 1$).

The transfer function magnitude $|H(j\omega)|$ decreases as (a increases (since it has only poles), so $|H(j\omega_0)| \geq a$ is equivalent to $$|H(j\omega_0)| \geq a \text{ for } \omega \leq \omega_0. \quad (29)$$

As shown below, this allows a minimum bandwidth or crossover frequency to be specified.

3 dB Bandwidth

The 3 dB bandwidth $\omega_{3dB}$ is the frequency at which the gain drops 3 dB below the DC open-loop gain, i.e., $|H(j\omega_{3dB})| = A_v/\sqrt{2}$. To specify that the 3 dB bandwidth is at least some minimum value $\omega_{3dB,min}$, i.e., $\omega_{3dB} \geq \omega_{3dB,min}$, is equivalent to specifying that $|H(j\omega_{3dB,min})| \geq A_v/\sqrt{2}$. This in turn can be expressed as $$A_v/|H(\omega_{3dB,min})|^2 \leq 2, \quad (30)$$

which is a posynomial inequality.

In almost all designs $p_1$ will be the dominant pole (see below), so that the 3 dB bandwidth is very accurately given by $$\omega_{3dB} = p_1 = \frac{g_{m1}}{A_vC_c}, \quad (31)$$

which is a monomial. Using this (extremely accurate) approximation, the 3 dB bandwidth can be constrained to equal some required value. Using the constraint (30), which is exact but inverse posynomial, the 3 dB bandwidth can be constrained to exceed a given minimum value.

Dominant Pole Conditions

The amplifier is intended to operate with $p_1$ as the dominant pole, i.e., $p_1$ much smaller than $P_2$, p3, and p4. These conditions can be expressed as $$\frac{p_1}{p_2} \leq 0.1, \frac{p_1}{p_3} \leq 0.1, \frac{p_1}{p_4} \leq 0.1, \quad (32)$$

where one decade, i.e., a factor of 10 in frequency, is (arbitrarily) used as the condition for dominance. These dominant pole conditions are readily handled by geometric programming, since $p_1$ is monomial and $p_2$, p3, and p4 are all inverse posynomial. In fact these dominant pole conditions usually do not need to be included explicitly since the phase margin conditions described below are generally more strict.

Unity-Gain Bandwidth and Phase Margin

The unity-gain bandwidth $\omega_c$ is defined as the frequency at which $|H(j\omega_c)| = 1$. The phase margin is defined in terms of the phase of the transfer function at the unity-gain bandwidth:

$$PM = \pi - \angle H(j\omega_c) = \pi - \sum_{i=1}^{4} \arctan\left(\frac{\omega_c}{p_i}\right).$$

A phase margin constraint specifies a lower bound on the phase margin, typically between 30° and 60°.

The unity-gain bandwidth and phase margin are related to the closed-loop bandwidth and stability of the amplifier and unity-gain feedback, i.e., when its output is connected to the inverting input. If the op-amp is to be used in some other specific closed-loop configuration, then a different frequency will be of more interest but the analysis is the same. For example, if the op-amp is to be used in a feedback configuration with closed-loop gain +20 dB, then the critical frequency is the 20 dB crossover point, i.e., the frequency at which the open-loop gain drops to 20 dB, and the phase margin is defined at that frequency. All of the analysis below is readily adapted for minimal changes to such a situation. For simplicity, the following description is directed to the unity-gain bandwidth.

First a constraint that the unity-gain bandwidth should exceed a given minimum frequency, i.e., $$\omega_c \geq \omega_{c,min}. \tag{330}$$

is addressed. This constraint is just a minimum gain constraint at the frequency $\omega_{c,min}$ (as in (29)), and so can be handled exactly by geometric programming as a posynomial inequality.

Here too an approximate expression is used for the unity-gain bandwidth which is monomial. If the parasitic poles $p_2$, $p_3$, and $p_4$ are assumed to be at least a small amount (for example, an octave) above the unity-gain bandwidth, then the unity-gain bandwidth can be approximated as the open-loop gain times the 3 dB bandwidth, i.e., $$\omega_{c,approx} = \frac{g_{m1}}{C_c}, \tag{34}$$

which is a monomial. If this approximate expression for the unity-gain bandwidth is used, the unity-gain bandwidth can be fixed at a desired value. The approximation (34) ignores the decrease in gain due to the parasitic poles, and consequently overestimates the actual unity-gain bandwidth (i.e., the gain drops to 0 dB at a frequency slightly less than $\omega_{c,approx}$).

The phase margin constraint is now addressed. The phase margin can be approximated very accurately by a posynomial function. Assuming the open-loop gain exceeds about 10, the phase contributed by the dominant pole at the unity-gain bandwidth, i.e., $\arctan(\omega_c(p_1))$, will be very nearly 90°. Therefore the phase margin constraint can be expressed as $$\sum_{i=2}^{4} \arctan\left(\frac{\omega_c}{p_i}\right) \leq \frac{\pi}{2} - PM, \tag{35}$$

i.e., the nondominant poles cannot contribute more than 90°–PM total phase shift.

Two reasonable approximations are used to form a posynomial approximation of the phase margin constraint (35). The first is an approximate unity-gain bandwidth $\omega_{c,approx}$ (from (34)) instead of the exact unity-gain bandwidth $\omega_c$ as the frequency at which the phase of H will be constrained. As mentioned above, $\omega_{c,approx} \leq \omega_c$, ( so the approximated specification is slightly stronger than the exact phase margin specification (since the phase is being constrained at a frequency slightly above the actual unity gain bandwidth). The arctan(x) is also approximated as a monomial. A simple approximation is given by arctan(x)≈x, which is quite accurate for arctan(x) less than 25°. Thus, assuming that each of the parasitic poles contributes no more than about 25° of phase shift, the phase margin constraint can be approximated accurately as $$\sum_{i=2}^{4} \frac{\omega_{c,approx}}{p_i} \leq \frac{\pi}{2} - PM_{min}, \tag{36}$$

which is a posynomial inequality in the design variables (since $\omega_{c,approx}$ is monomial). The approximation error involved here is almost always very small for the following reasons. The constraint (36) makes sure none of the nondominant poles is too near $\omega_c$. This, in turn, validates the approximation $\omega_{c,approx} \approx \omega_c$. It also ensures that the approximation that the phase contributed by the nondominant poles is $\Sigma_{i+2}^{4}\omega_c/p1$ is good.

Finally note that it is possible to obtain a more accurate monomial approximation of arctan(x) that has less error over a wider range, e.g., arctan(x)≦60°. For example the approximation arctan(x)≈0.75x$^{0.7}$ gives a fit of around ±3° for angles between 0 and 60°.

OTHER CONSTRAINTS

In this section it is shown that several other important constraints can be described in monomial or posynomial form.

Slew Rate

The slew rate can be expressed as

SR=min $\{2I_1/C_c, I_7/(C_c+C_{TL})\}$.

In order to ensure a minimum slew rate $SR_{min}$ the two constraints $$\frac{C_c}{2I_1} \leq \frac{1}{SR_{min}}, \quad \frac{C_c + C_{TL}}{I_7} \leq \frac{1}{SR_{min}} \tag{37}$$

can be imposed. These two constraints are posynomial.

Common-Mode Rejection Ratio

The common-mode rejection ratio (CMRR) can be approximated as $$CMRR = \frac{2g_{m1}g_{m3}}{(g_{03}+g_{01})g_{05}} = \frac{2C_{ox}}{(\lambda_n+\lambda_p)\lambda_p}\sqrt{\mu_n\mu_p\frac{W_1W_3}{L_1L_3I_5^2}}, \tag{38}$$

which is a monomial. In particular, a minimum acceptable value of CMRR can be specified.

Negative Power Supply Rejection Ratio

The negative power supply rejection ratio (nPSRR) is given by $$nPSRR = \frac{g_{m2}g_{m6}}{(g_{02}+g_{04})g_{06}}\frac{1}{(1+s/p_1)(1+s/p_2)}. \tag{39}$$

Thus, the low-frequency nPSRR is given by the inverse posynomial expression $$nPSRR = \frac{g_{m2}g_{m6}}{(g_{02}+g_{04})g_{06}} \tag{40}$$

which, therefore, can be lower bounded.

The high-frequency PSRR characteristics are generally more critical than the low-frequency PSRR characteristics since noise in mixed-mode chips (clock noise, switching regulator noise, etc.) is typically high frequency. One can see that the expression for the magnitude squared of the nPSRR at a frequency $\omega_0$ has the form $$|nPSRR(j\omega_0)|^2 = \frac{A_p^2}{(1+\omega_0^2/p_1^2)(1+\omega_0^2/p_2^2)}$$

where $A_p$, $p_1$ and p2 are given by inverse posynomial expressions. As was described in the Minimum Gain at a Frequency section above, a lower bound can be imposed on the nPSRR at frequencies smaller than the unity-gain bandwidth by imposing posynomial constraints in the form $$|nPSRR(j\omega_0)| \geq a. \tag{41}$$

Noise Performance

The equivalent input-referred noise power spectral density $S_{in}(f)^2$ (in $V^2/Hz$, at frequency $f$ assumed to be smaller than the 3 dB bandwidth), can be expressed as $$S_{in}^2 = S_1^2 + S_2^2 + \left(\frac{g_{m3}}{g_{m1}}\right)^2 (S_3^2 + S_4^2), \tag{42}$$

where $S_k^2$ is the input-referred noise power spectral density of transistor $M_k$. These spectral densities consist of the input-referred thermal noise and a $1/f$ noise:

$$S_k(f)^2 = \left(\frac{2}{3}\right)\frac{4kT}{g_{m,k}} + \frac{K_f}{C_{ox}W_k L_k f}.$$

Thus the input-referred noise spectral density can be expressed as
$$S_{in}(f)^2 = a/f + \beta,$$
where $$\alpha = \frac{2K_p}{C_{ox}W_1 L_1}\left(1 + \frac{K_n \mu_n L_1^2}{K_p \mu_p L_3^2}\right),$$

$$\beta = \frac{16KT}{3\sqrt{2\mu_p(C_{ox}(W/L))_1 I_1}}\left(1 + \sqrt{\frac{(\mu_n(W/L))_3}{(\mu_p(W/L))_1}}\right).$$

Note that $\alpha$ and $\beta$ are (complicated) posynomial functions of the design parameters.

Therefore spot noise constraints can be imposed, i.e., require that $$S_{in}(f)^2 \leq S_{max}^2 \tag{43}$$

for a certain $f$, as a posynomial inequality. Multiple spot noise constraints, at different frequencies, can also be imposed as multiple posynomial inequalities.

The total RMS noise level $V_{noise}$ over a frequency band $[f_0, f_1]$ (where $f_1$ is below the equivalent noise bandwidth of the circuit) can be found by integrating the noise spectral density:

$$V_{noise}^2 = \int_{f_0}^{f_1} S_{in}(f)^2 df = \alpha \log(f_1/f_0) + \beta(f_1-f_0).$$

Therefore imposing a maximum total RMS noise voltage over the band $[f_0, f_1]$ is the posynomial constraint $$\alpha \log(f_1/f_0) + \beta(f_N-f_0) \leq V_{max}^2 \tag{44}$$

(since $f_1$ and $f_0$ are fixed, and $\alpha$ and $\beta$ are posynomials in the design variables).

Summary of Constraints and Specifications

Since all the op-amp performance measures and constraints shown above can be expressed as posynomial functions and posynomial constraints, a wide variety of integrated circuit design problems can be solved via geometric programming with the CAD system of the present invention. For example, for op-amp 400, the bandwidth can be maximized subject to given (upper) limits on op-amp power, area, and input offset voltage, and given (lower) limits on transistor lengths and widths, and voltage gain, CMRR, slew rate, phase margin, and output voltage swing. The resulting optimization problem is a geometric programming problem.

The problem may appear to be very complex, involving many complicated inequality and equality constraints, but in fact can be readily solved in seconds.

DESIGN FOR PROCESS ROBUSTNESS

Up to this point parameters such as transistor threshold voltages, mobilities, oxide parameters, channel modulation parameters, supply voltages, and load capacitance have all been assumed to be known and fixed. This section describes how the present invention can be used to develop designs that are robust with respect to variations in these parameters, i.e., designs that meet a set of specifications for a set of values of these parameters. The basic idea is to list a set of possible parameters, and to replicate the design constraints for all possible parameter values. The method is practical only because the present invention geometric programming system can readily handle problems with many hundreds, or even thousands, of constraints; the computational effort grows approximately linearly with the number of constraints.

Let $\alpha \in R^k$ denote a vector of parameters that may vary. Then the objective and constraint functions can be expressed as functions of x (the design parameters) and a (which hereinafter refers to the process parameters, even if some components, e.g., the load capacitance, are not really process parameters):

$$f_0(x,\alpha), f_i(x,\alpha), g_i(x,\alpha).$$

The functions $f_i$ are all posynomial functions of x, for each a, and the functions $g_i$ are all monomial functions of x, for each $\alpha$. Let $A = \{\alpha_1, \ldots \alpha_N\}$ be a (finite) set of possible parameter values. The goal is to determine a design (i.e., x) that works well for all possible parameter values (i.e., $\alpha_1, \ldots, \alpha_N$).

First several methods of constructing the set A are described. As a simple example, suppose there are six parameters, which vary independently over intervals $[\alpha min, i, \alpha_{max,i}]$. Each interval could be sampled with three values (e.g., the midpoint and extreme values), and then every possible combination of parameter values could be formed, which then results in $N=3^6$.

Every possible combination of parameter values is not given, rather only the ones likely to actually occur are given. For example if it is unlikely that the oxide capacitance parameter is at its maximum value while the n-threshold voltage is maximum, then these combinations are deleted from the set A. In this way the dependencies can be modeled between the parameter values.

The set A can be constructed as follows. Suppose a design is required that works, without modification, on several processes, or several variations of processes. Then A is a list of the process parameters for each of the processes.

The robust design is achieved by solving the problem minimize $\max_{\alpha \in A} f_0(x,\alpha)$ subject to $f_i(x,\alpha) \leq 1$, i=1, ... m, for all $\alpha \in A$, (45)

$g_i(x,\alpha)=1$, i=1, ..., p, for all $\alpha \in A$, $x_i > 0$, i=1, ..., n

This problem can be reformulated as a geometric program with N times more constraints, and an additional scalar variable $\gamma$:

minimize $\gamma$ subject to $f_0(x,\alpha_j) \leq \gamma$, j=1, ..., N, $f_i(x,\alpha_j) \leq 1$, i=1, ..., m, j=1,

..., N, $g_1(x,\alpha_j)=1$, $i=1, \ldots, p$, $j=1, \ldots, N$, $x_i > 0$, $i=1, \ldots, n$ \hfill (46)

The solution of (45) (which is the same as the solution of (46)) satisfies the specifications for all possible values of the process parameters. The optimal objective value gives the (globally) optimal minimax design. (It is also possible to take an average value of the objective over process parameters, instead of a worst-case value.)

Equality constraints have to be handled carefully. Provided the transistor lengths and widths are not subject to variation, equality constraints among them (e.g., matching and symmetry) are likely not to depend on the process parameter $\alpha$. Other equality constraints, however, can depend on $\alpha$. When an equality constraint is enforced for each value of $\alpha$, the result is usually an infeasible problem. For example suppose that the open-loop gain is specified to be exactly 80 dB. Process variation will change the open-loop gain, making it impossible to achieve a design that yields open-loop gain of exactly 80 dB for more than a few process parameter values. The solution to this problem is to convert such specifications into inequalities. The specification might, for example, be changed to require that the open-loop gain be more than 80 dB, or that it be between 80 dB and 85 dB. Either way the robust problem now has at least a chance of being feasible.

It's important to contrast a robust design for a set of process parameters $A=\{\alpha_1, \ldots, \alpha_N\}$ with the optimal designs for each process parameter. The objective value for the robust design is worse (or no better than) the optimal design for each parameter value. This disadvantage is offset by the advantage that the design works for all the process parameter values.

So far the case in which the set A is finite has been described. But in most real cases it is infinite; for example, individual parameters lie in ranges. As described above, such situations can be modeled or approximated by sampling the interval. While this appears to always work in practice, it gives no guarantee, in general, that the design works for all values of the parameter in the given range; it only guarantees performance for the sampled values of the parameters.

There are many cases, however, when the performance for a parameter value can be guaranteed in an interval. Suppose that the function $f_i(x,\alpha)$ is posynomial not just in x, but in x and $\alpha$ as well, and that $\alpha$ lies in the interval $[\alpha_{min}, \alpha_{max}]$. ($\alpha$ is taken to be scalar here for simplicity.) Then it suffices to impose the constraint at the endpoints of the interval, i.e.:

$f_i(x,\alpha_{min}) \leq 1$, $f_i(x,\alpha_{max}) \leq 1$, $\Rightarrow f_i(x,\alpha) \leq 1$, for all $\alpha \in [\alpha_{min}, \alpha_{max}]$.

This is easily proved using convexity of the log $f_1$ in the transformed variables.

The constraints described above are posynomial in the parameters $C_{ox}, \mu_n, \mu_p, \gamma_n, \gamma_p$, and the parasitic capacitances. Thus, for these parameters at least, ranges can be handled with no approximation or sampling, by specifying the constraints only at the endpoints.

The requirement of robustness is a real practical constraint, and is currently dealt with by many methods. For example, a minimum gate overdrive constraint is sometimes imposed because designs with small gate overdrive tend to be nonrobust. The point of this section is that robustness can be achieved in a more methodical way, which takes into account a more detailed description of the possible uncertainties or parameter variations. The result will be a better design than an ad-hoc method for achieving robustness.

ALTERNATE EMBODIMENTS

The present invention can be implemented as a computer program product that includes a computer program mechanism embedded in a computer readable storage medium. For instance, the computer program product could contain the program modules shown in FIG. 2. These program modules may be stored on a CDROM, magnetic disk storage product, or any other computer readable data or program storage product. The software modules in the computer program product may also be distributed electronically, via the Internet or otherwise, by transmission of a computer data signal (in which the software modules are embedded) on a carrier wave.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A method of designing and optimizing an analog circuit having active and passive components comprising the steps of:

generating expressions, comprising posynomial functions of design parameters, for a plurality of performance specifications for said analog circuit topology with at least one active component being in saturation for all inputs and outputs to said analog circuit;

defining optimization values for at least one of said performance specifications;

generating a geometric program comprising the performance specification posynomial functions; and solving the geometric program to provide globally optimal design parameter values of the at least one integrated circuit topology for the defined optimization values.

2. The method of claim 1 wherein the step of generating a geometric program comprising the performance specification posynomial functions, further comprises generating a geometric program in the form:

minimize $f_0(x)$ subject to $f_i(x) \leq e^{u_i}$, $i=1, \ldots, m$, $g_i(x) = e^{v_i}$, $i=1, \ldots, p$, $x_i > 0$, $i=1, \ldots, n$.

where $f_0(x)$ is an optimal objective value of the geometric program, and $f_i(x)$ are posynomial constraints, $g_i(x)$ are monomial constraints, and $u_i$ and $v_i$ are real numbers. of $f_i(x) \leq e^{u_i}$, $i=1, \ldots, m$ where $f_i(x)$ is a posynomial function, to provide a geometric program for performing a sensitivity analysis.

3. The method of claim 1 further comprising the step of defining posynomial functions for performance specifications of said analog topolowv using a symbolic analyzer.

4. The method of claim 1 wherein said active components comprise MOS transistors, and wherein said method further comprises the step of modeling a saturation region of said MOS transistors using a long channel square law model.

5. The method of claim 1 wherein said geometric program is formulated as a convex optimization problem and wherein exponents in said geometric program can be defined to be any real number.

6. The method of claim 5 wherein said analog circuits comprise an integrated circuit selected from a library of analog integrated circuit topologies.

7. The method of claim 6 wherein said performance specifications include a circuit area constraint wherein the circuit area is approximated by a sum of a constant plus a sum of transistor and capacitor areas.

8. The method of claim 6 wherein said analog integrated circuits further comprise amplifier circuits.

9. The method of claim 8 wherein said performance specifications include a voltage gain specification.

10. The method of claim 8 wherein said performance specifications include pole location constraints.

11. The method of claim 8 wherein said performance specifications include a 3 dB bandwidth constraint wherein the 3 dB bandwidth is approximated as being equal to a dominant pole.

12. The method of claim 8 wherein said performance specifications include a unity gain bandwidth specification wherein the unity gain bandwidth is approximated as an open-loop gain times a 3 dB bandwidth.

13. The method of claim 12 wherein said performance specifications include a phase margin where the phase margin is approximated using the approximated unity gain bandwidth and a monomial approximation of arctangent.

14. The method of claim 8 wherein said performance specifications include noise constraints.

15. The method of claim 1 further comprising the step of indicating that the defined optimization values are not feasible, when a solution to the geometric program does not exist.

16. A method of designing and optimizing an analog integrated circuit having active and passive components comprising the steps of:

generating expressions, comprising posynomial functions of design parameters, for a plurality of performance specifications for said analog integrated circuit where for all inputs to and outputs from said analog integrated circuit at least one active component of said analog integrated circuit is in saturation;

defining optimization values for at least one of said performance specifications;

defining at least one robustness constraint comprising a range of at least one process variable over which an optimal design must meet the performance specifications;

defining a geometric program in a robust geometric program for including the performance specifications and the robustness constraint; and solving the geometric program to provide globally optimal design parameter values of said analog integrated circuit for the defined optimization values.

17. The method of claim 16 wherein said robust geometric program form comprises:

minimize $\gamma$ subject to $f_0(x,\alpha_j) \leq \gamma$, j=1, ..., N, $g_i(x,\alpha_j)=1$, i=1, ..., p, J=1, ..., N, $x_i>0$, i=1, ..., n wherein $\gamma$ is a scalar variable, x denotes design parameters, $\alpha_j$ denotes process parameters, $f_0(x,\alpha_j)$ is a function to be optimized and is a posynomial function of x for each $\alpha$, $f_i(x,\alpha_j)$ are posynomial functions of x for each $\alpha$, and $g_i(x,\alpha_j)$ are monomial functions of x for each $\alpha$.

18. The method of claim 17 wherein at least one of said robustness constraints is substantially specified only at endpoints of a range.

19. A computer program product for use in conjunction with a computer system, the computer program product comprising a computer readable storage medium and a computer program mechanism embedded therein, the computer program mechanism comprising a computer aided design system for designing and optimizing analog integrated circuits having active and passive components comprising:

(a) a library module of analog integrated circuit topologies;

(b) instructions for generating expressions, comprising posynomial functions of design parameters, for a plurality of performance specifications of at least one analog integrated circuit topology from said library where the at least one analog integrated circuit topology includes one transistor which is in saturation for all inputs and output from said integrated circuit topology;

(c) instructions for defining optimization values for at least one of said performance specifications;

(d) instructions for generating a geometric program comprising the performance specification posynomial functions; and (e) instructions for solving the geometric program to provide globally optimal design parameter values of the at least one integrated circuit topology for the defined optimization values.

20. The computer program product of claim 19 wherein said geometric program is formulated as a convex optimization problem and wherein exponents in said geometric program can be defined to be any real number.

* * * * *